United States Patent
Zang et al.

(10) Patent No.: US 7,991,568 B2
(45) Date of Patent: Aug. 2, 2011

(54) DIGITAL MULTIMETER WITH AUTOMATIC MEASUREMENT SELECTION FUNCTION

(76) Inventors: Jiajing Zang, Shenzhen (CN); Yulun Zang, Shenzhen (CN)

(*) Notice: Subject to any disclaimer, the term of this patent is extended or adjusted under 35 U.S.C. 154(b) by 56 days.

(21) Appl. No.: 12/406,214

(22) Filed: Mar. 18, 2009

(65) Prior Publication Data

US 2009/0287436 A1    Nov. 19, 2009

Related U.S. Application Data

(63) Continuation of application No. PCT/CN2006/003611, filed on Dec. 26, 2006.

(30) Foreign Application Priority Data

Sep. 18, 2006  (CN) .......................... 2006 1 0062667

(51) Int. Cl.
    *G01R 19/00*    (2006.01)
(52) U.S. Cl. ........................................................ 702/64
(58) Field of Classification Search .............. 702/64–68; 324/76.11, 111–112
    See application file for complete search history.

(56) References Cited

U.S. PATENT DOCUMENTS

| | | | | |
|---|---|---|---|---|
| 4,663,586 A | * | 5/1987 | Swerlein et al. | 324/115 |
| 5,113,188 A | * | 5/1992 | Kuo et al. | 341/133 |
| 5,396,168 A | * | 3/1995 | Heep et al. | 324/115 |
| 5,508,607 A | * | 4/1996 | Gibson | 324/121 R |
| 5,530,373 A | * | 6/1996 | Gibson et al. | 324/758 |
| 5,557,197 A | * | 9/1996 | Schulze et al. | 324/115 |
| 6,243,034 B1 | * | 6/2001 | Regier | 341/166 |
| 2010/0026383 A1 | * | 2/2010 | Ahrari et al. | 327/551 |

FOREIGN PATENT DOCUMENTS

GB            2273365 A    *   6/1994

* cited by examiner

*Primary Examiner* — Cindy Hien-Dieu Khuu
(74) *Attorney, Agent, or Firm* — Matthias Scholl P.C.; Matthias Scholl

(57) ABSTRACT

A digital multimeter comprising a measured object input terminal, conversion circuit for a fast analog/digital converter, microprocessor, auxiliary program-controlled voltage or current source, potential divider network, electronic switches, and display. Compared with conventional multimeters, the adoption of fast analog/digital conversion technology as well as a method that applies an auxiliary power supply at the time of a passive analog measurement allows for measuring different responses between input terminals after an auxiliary power supply is applied, thus being able to automatically determine the characteristics and size of the measured object.

7 Claims, 4 Drawing Sheets

DIGITAL MULTIMETER WITH AUTOMATIC MEASUREMENT SELECTION FUNCTION

CROSS-REFERENCE TO RELATED APPLICATIONS

This application is a continuation of International Patent Application No. PCT/CN2006/003611 with an international filing date of Dec. 26, 2006, designating the United States, now pending, and further claims priority benefits to Chinese Patent Application No. 200610062667.X, filed on Sep. 18, 2006. The contents of these specifications are incorporated herein by reference.

BACKGROUND OF THE INVENTION

1. Field of the Invention

The invention relates to a digital multimeter, and particularly to a digital multimeter that realizes automatic selection of multiple categories of analog amount measurement functions and measuring ranges based on measured objects, using a voltmeter consisting of a fast analog/digital converter as the core, together with a proper auxiliary power supply, microprocessor, and electronic switches.

2. Description of the Related Art

Common digital multimeters generally provide mechanical or button-type function selection switches for users to judge and select measurements, themselves. For example, with regards to whether a measured object provides DC/AC voltage, resistance, or DC/AC current, the knob switch is turned to the corresponding function measurement position and some electrical connections are generated by metal contacts to form certain measurement circuits corresponding to the DC/AC voltage, resistance, or current measurements. Digital multimeters with an automatic measuring range can, after selecting a measurement function, select a proper measuring range using different combinations of internal electronic positions in accordance with the size of the measured object. Therefore, digital multimeters can complete measurements that yield measured values of different sizes (e.g., DC voltage) after only one position is selected for the measurement function (e.g., DC voltage). Multimeters with a manual measuring range require that the user select one of several positions appropriate for measuring a certain measurement function if the measurement value falls within the measurement scope (e.g., DC voltage). No existing multimeter can select all measurement functions automatically.

Designs have been described which add the automatic selection of the measurement function based on a digital multimeter with automatic measuring ranges. However, a signal-type detector is generally required to detect the type of analog input signal. The types of analog input signal that can be detected for this purpose are limited. Moreover, the influences of the input impedance and switches in signal-type detectors reduce the performance of multimeters with auto- matic selection of measurement functions, even giving them little practical value.

A considerable improvement has been made for multimeters with automatic selection of measurement functions in China patent number 200310112175.3, bringing the multimeter with automatic selection of measurement functions into practical use. However, in terms of the automatic selection of non-voltage/current passive analog input, great limits remain, such as for the measurement of capacitance, inductance, and diode voltage.

An objective of the invention is to provide a new type of digital multimeter with an automatic measuring range selection function, which not only can automatically select the measurement function based on whether the measured object provides DC/AC voltage, resistance, or DC current, but which has the feature of automatically selecting the measurement function among more types of passive components, including resistance, such as measurements of resistance, capacitance, inductance, and diode voltage. Under the simplest conditions, the ON/OFF functionality of this multimeter can be performed only by the ON/OFF switch of a power supply. Moreover, this multimeter has a response speed that is faster than that of common multimeters that automatically detect measurement ranges during measurements.

SUMMARY OF THE INVENTION

The objective of the invention is implemented as follows: the digital multimeter that automatically selects measurement functions in this invention includes measured object input terminals, conversion circuits for fast analog/digital conversion, a microprocessor, an auxiliary program-controlled voltage or current source, a potential divider network, an electronic switch, and a display. The fast analog/digital converter connects the measured object input terminals through the potential divider network for the fast measurement of the voltage between input terminals; the fast analog/digital converter outputs data to the microprocessor for analysis and processing, and the microprocessor controls the electronic switch in the switching of the potential divider network and the range of the measurement; and the measurement result is sent to the display for displaying after being processed by the microprocessor.

In the invention, when the multimeter detects an external voltage at the input terminals, the microprocessor automatically judges, based on whether there is cyclic change of polarity in the data output from the fast analog/digital converter, whether the signal is DC or AC, and determines the polarity and value of the DC signal as well as several numerical results, including peak value, effective value, frequency, and cycle by analysis and processing. Of course, only when the sampling speed of the fast analog/digital converter is several-fold higher than the frequency of the measured AC signal can the measured AC signal be precisely measured.

In the invention, when the multimeter does not detect any external voltage, it will enter the measurement procedure for a passive analog measured object. The microprocessor directs the auxiliary program-controlled voltage/current source to produce an output at the input terminal, and the fast analog/ digital converter circuit inputs the measured result into the microprocessor for analysis to judge the nature of the measured passive analog object. When the auxiliary program-controlled voltage/current is active, the analog measurement on the object at the input terminal proceeds and the connection to the input terminal will be cut off; when the auxiliary program-controlled voltage/current is passive, the analog measurement on the object at the input terminal proceeds, and the connection to the input terminal will be connected. The fast analog/digital converter circuit and program-controlled voltage/current source controlled by the microprocessor combine to select among multiple types of analog quantitative measurements, in addition to measuring the appropriate measurement range. Quantitative analog object measurements proceed as follows: the auxiliary program-controlled source first outputs a micro test current such that the input terminal makes a circuit with a high input impedance.

In the invention, the microprocessor receives the output measurement data and controls the electronic switch of the program-controlled voltage/current sources based on the data output control signal to change the nature and size of the program-controlled source and, thus, the measurement range. By storing partial measurement data, the microprocessor can store and display the graphic waveform of the varying input signal as a function of time as well as a graphic display of value variation over time.

In the invention, a selection button that connects the microprocessor is provided. This button enables the user to exit from the automatic selection of a measurement so that the measurement function may be switched at each push of the button.

In contrast with existing technology, this invention adopts fast analog/digital conversion technologies and a method by which a certain auxiliary power source is applied when measuring the passive analog signal, to measure several responses between input terminals after an auxiliary power source is applied during measurements on passive devices. The invention provides a multimeter that automatically selects measurement functions, permitting the automatic judgment of the nature and size of the measured object signal to make possible the automatic selection of measurement functions for more types of analog signal than have previously been possible. Previously, automatic identification and automatic selection of measurement range have not been possible.

In contrast with existing technology, during measurement of an AC signal, the multimeter not only determines the true effective value of the AC signal, but obtains data about the AC signal, including frequency and peak voltage. Common multimeters can currently achieve true effective value measurements only by converting the AC signal into a DC signal by using a special true effective value converter. In contrast with the common true effective value multimeter, this multimeter does not make errors in judging the range of an AC signal that has a non-sine large crest factor (high peak voltage but small effective value). Common true effective value multimeters can make errors in judging the range of a signal, which can generate large measurement inaccuracies and errors.

In contrast with existing technology, this multimeter can always obtain more precise data in terms of DC signal measurements from an AC half-wave rectification or full-wave rectification, or in terms of measurements of unidirectional pulse signals.

In contrast with existing technology, this invention uses improvements in measurement speed by adopting fast analog/digital conversion technology. Not only can the multimeter measure the transitional responses of energy storage elements, including capacitance and inductance, but the multimeter shortens the time required for the probing measurement that determines the function. The time required for measuring the signal range and for switching is also shortened, and the response of the entire multimeter is greatly increased. Problems associated with a long standby time in common multimeters with automatic range measurements are thereby solved.

This invention can seamlessly integrate a warning function into the multimeter that automatically selects measurement functions by providing a warning sound when a resistance value is less than a certain expected value. In other multimeters, this function and the diode measurement function can be realized by setting separate measurement function positions. This step provides continuity measurements that provide a fast response because the analog comparison method is fast. Because common multimeters with automatic measurement range detection undergo several range conversions from the open circuit of the meter to the measurement of a resistance below a certain value (e.g., 30 ohm), the response is slow.

DETAILED DESCRIPTION OF THE INVENTION

The accompanying drawings disclose an embodiment of the invention, which should not be interpreted as a particular limitation to the structure of the invention. Further descriptions will be given below in conjunction with the accompanying drawings.

Figure 1:
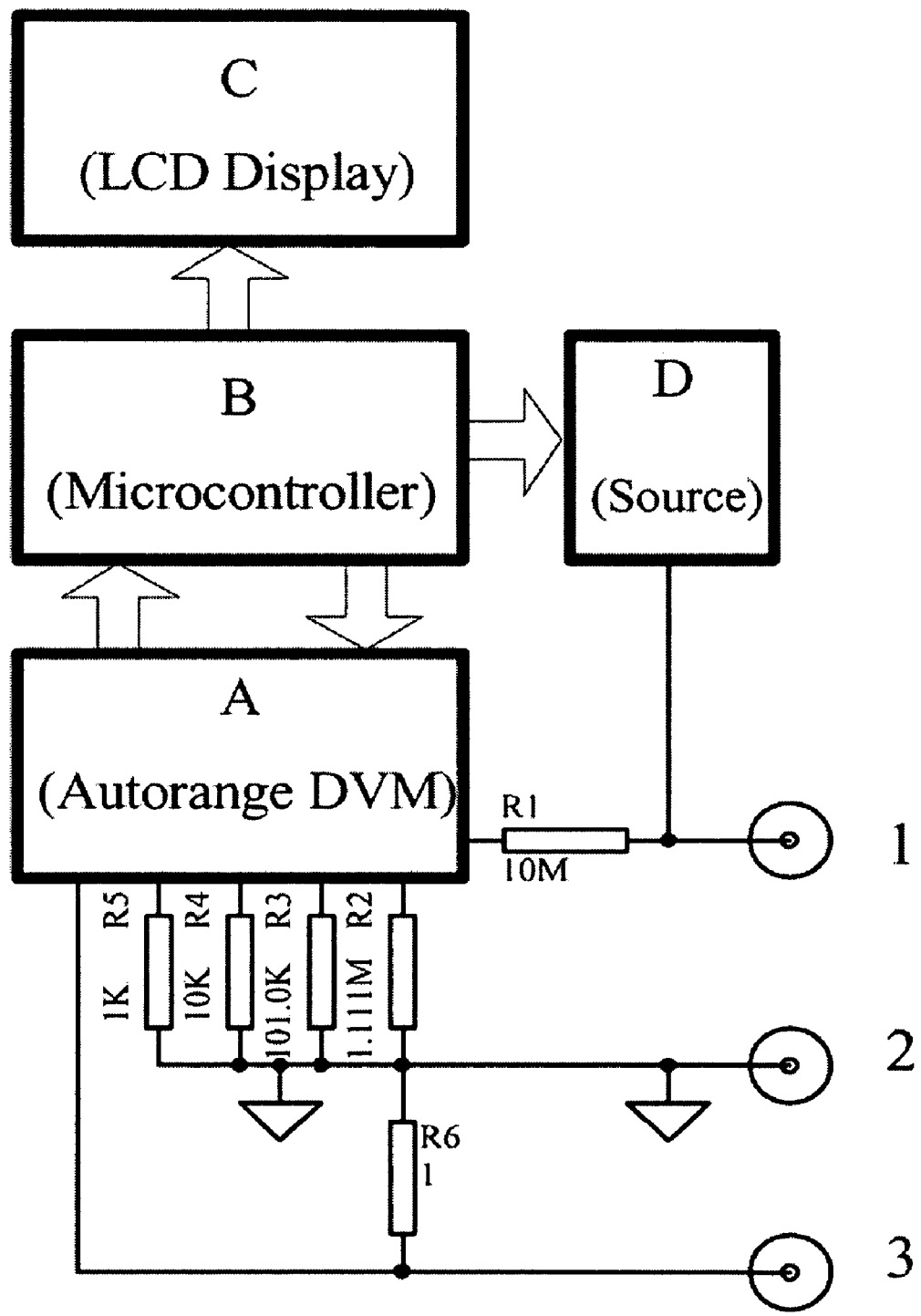
FIG. 1 shows a block diagram of the main features involved in implementing the multimeter based on this invention.

Below is the further detailed description of this invention in combination with the attached diagrams. FIG. 1 includes three input terminals: 1, 2, and 3 as well as four circuit parts: A, B, C, and D. Among the circuit parts, Part A is a Fast Analog/Digital Converter; Part B is a Microprocessor; Part C is a Display, and Part D is a Voltage/Current Source controlled by Part B. Input Terminal 2 is a common input terminal, which, just like a common multimeter, represents the measured signal ground. Input Terminal 1 is the input terminal of all measured analog signals except for the current measurement. During measurement, the object providing the measured analog signal is connected between Terminals 1 and 2. Input Terminal 3 is the input terminal for the current measurement, and the measured current signal is connected between Input Terminals 3 and 2. A Resistance R6 is already connected between Input Terminals 3 and 2, the function of which is to convert the current signal into a voltage signal. During a current measurement, the voltmeter with automatic measuring range formed by a fast analog/digital converter measures the voltage between Terminals 3 and 2, which represents the nature and size of the measured current. The selection of the size and power of the R6 resistance depends on the size of the measurement current. When a current measurement is not necessary, this input terminal and R6 can be ignored.

In FIG. 1, Part A is a voltmeter with an automatic range that takes the fast analog/digital converter as the core and adds an electronic switch controlled by Part B as well as Resistances R1, R2, R3, R4, and R5. In accordance with the size of the input voltage, the ON/OFF of the electronic switch controlled by Part B allows R1-R5 to be combined into a potential divider network with a voltage ratio of 1, 10, 100, 1000, and 10000, enabling input voltages of different size to be converted into the measurement scope of the fast analog/digital converter. For example, the corresponding voltage range is 400 mV, 4 V, 40 V, 400 V and 1000 V. Under a voltage ratio of 1, that is, with direct input of a 400 mV basic range without attenuation, Part A has very high input impedance. Part A has an impedance of 10 MΩ under other conditions. Just as the conversion speed of the fast analog/digital converter is fast enough, the data and variations between the input terminals can be obtained within a certain scope. The fast analog/digital converter here refers to a converter that can convert more than several thousand times per second, rather than the low-speed analog/digital converter used in common multimeters that can convert only several times per second. Moreover, the adoption of fast analog/digital converters decreases the time required for the multimeter to judge the measurement functions and convert the signal to a proper range, unlike the existing common multimeters with automatic range detection that wait for a long time to obtain a stable measurement result.

Part B is a microprocessor, which both receives measurement data output from Part A and outputs a control signal to control the electronic switch of Part A and change the range based on the conditions of the data, making Part A a voltmeter with automatic range detection. In fact, a waveform graphic showing the input signal variation as a function of time can be stored by storing the partial measurement data output of Part A. For this reason, in accordance with the variations in the voltage signal and cyclic changes of direction (polarity), the multimeter can identify if the voltage signal is AC or DC, or both, and make corresponding adjustments. It can set the display to show not only the numeric results of the measurement, but also the waveform graphic of the measured signal or its value variation along with the time, on demand. If the voltage exceeds the preset threshold value between Input Terminals 1 and 2, the multimeter will enter and keep the voltage measurement and automatically reposition the range as needed. The purpose of setting a threshold value is to avoid generation of an error function judgment caused by external interference signals in the event of an open circuit at the input terminals.

If Part A does not detect any voltage signals that exceed the threshold value for a period of time (e.g., 10 ms), Part B enters the test procedures for passive analog signals. Part B controls Part D and generates a controlled current input to Input Terminal 1. The output of Part D is not connected with the Input Terminal 1 prior to this. The non-voltage measurement object can be judged as a resistor, a diode, a capacitor, or an inductor, or that the input terminal is under open circuit conditions in accordance with the measurement as a result of voltage variations between Input Terminals 1 and 2 by Part A at that time.

If Input Terminals 1 and 2 are detected as being under open circuit conditions, Part B controls Part A to switch to measuring the voltage between the input terminals 3 and 2. When a voltage exceeding a certain threshold value is detected, the multimeter will be in a current measurement state. The process for identifying AC or DC current is the same as that used to identify the voltage, described above.

If no current input is detected between Input Terminals 3 and 2, Part B will return the measurement to the original state, enabling Part A to begin detecting the voltage between Input Terminals 1 and 2. Repeat, according to the above steps.

Part C shows a display, which can display the corresponding measurement results and unit symbol in accordance with the data from the Part B output. If required, the waveform graphic or variation graphic of various measured objects, along with the time and measured numeric results, can be displayed during AC voltage or current measurement, which can be performed in the same manner as when Part B stores and outputs a proper data signal.

Part D is the voltage or current source controlled by Part B. Controlled by Part B, Part D can output a voltage or current signal of different size and waveform to Input Terminal 1, meeting the demands of measurements on different measured objects. For example, 0.01 µA, 1 µA, or 1 mA DC current or triangle wave current of different slope can be output. The maximum output voltage is controlled to be, for example, 2 V. Under the voltage measurement state, the connection between Part D and Input Terminal 1 is opened.

The principle by which measurements of resistance, capacitance, inductance, and diode voltage are discriminated is the different response times against applied voltage or current sources.

When a measured object is a resistor, diode, an energy storage element capacitor, or an inductor, the voltage/current relation is, respectively:

1) Relationship between a voltage $u_R$ and a current $i_{R_c}$ flowing against a resistance is:

$$u_R = i_{R_c} R, \text{ or } R = \frac{u_R}{i_R} \quad (1)$$

2) Relationship between a current $i_c$ flowing into capacitor C with voltage $u_c$ on the capacitor according to the time rate of change $$\frac{du_c}{dt}$$

is:

$$i_c = c\frac{du_c}{dt}, \text{ or } i_c = c\frac{\Delta u_c}{\Delta t} \quad (2)$$

3) Relationship between a current $i_L$ flowing through an inductor L with a voltage $u_L$ on the inductor according to the time rate of change $$\frac{di_L}{dt}$$

is:

$$u_L = L\frac{di_L}{dt}, \text{ or } u_L = L\frac{\Delta i_L}{\Delta t} \quad (3)$$

4) For a voltage/current relationship in a diode, the following expression of the diode's PN junction V-A characteristics, based on principles of semi-conductor physics, is commonly called the diode equation:

$$I = I_S(e^{U/U_T} - 1) \quad (4)$$

In the equation, $I_S$ is the reverse saturation current, $U_T$ is the temperature's current equivalent. Under normal temperatures (300 K), $U_T \approx 2.6$ mV.

From the above diode equation, we can see that if a backward voltage U<0 is applied to the diode and $|U| >> U_T$, $I \approx -I_S$. That is, the backward voltage is basically of a constant value. If a forward voltage is applied to the diode, U>0 and $U>>U_T$, then $e^{U/U_T} >> 1$ in the above equation, and thus $I \approx I_S e^{U/U_T}$, showing that the forward current I and voltage U are basically exponentially related.

Generally, when measuring a diode using a multimeter, the diode is measured in both the forward and backward directions to judge its quality. This measurement gives OL in the backward direction because the diode shows a high impedance. A forward voltage drop is observed for the diode in the forward direction. Usually, the forward voltage drop is measured at a current of 1 mA.

For this reason, when measuring a resistance, Part A will not measure any voltage when passing through passive components, including a discharged capacitor, inductor, or diode. At that time, Part D injects a constant current or voltage from a source, with a resistance of certain value connected in series to the Input Terminal 1. The measured object connected between Input Terminals 1 and 2, such as a resistor, capacitor, inductor, or diode, will show a different response, resulting from the different variations in voltage between the Input Terminals 1 and 2.

If a measured object is a resistor, Formula (1) indicates that the voltage measured by Part A is in direct proportion with the resistance value and the current through the resistance. For this reason, when Part D, controlled by the microprocessor, generates and applies a known constant current, the voltage measured by Part A is a fixed value. Because the value of the constant value is changed, the voltage on the resistor will change in proportion. By calculating the ratio between the voltage measured by Part A and the known constant current, we can derive the numeric result of the resistance value. The state exceeding the maximum resistance measurement scope regulated by the multimeter is viewed as an open circuit. The proportion method commonly seen in common multimeters can also be adopted in measuring the resistance.

Measurements of a diode are similar to those of a resistor, but different from those of a capacitor or inductor. Because capacitors and inductors pertain to energy storage elements, they show time-dependent responses when a constant current is applied suddenly at both ends. For backward measurements on a diode, application of a constant current to both ends generally yields a state of higher impendence or open circuit, even at the highest output voltage (e.g., 2 V) from Part D, by making Part D unable to output the expected current value. For forward measurements, Formula (4) indicates that when Part D controlled by the microprocessor generates and applies a known constant current, the voltage measured by Part A is a fixed value, representing a fixed impendence. By changing the value of the constant current, the voltage measured by Part A will not change in proportion to the resistance. The higher the current, the lower the impedance. For this reason, diode measurements can be distinguished from resistance measurement states. When the constant current is changed by 1 mA, a numeric value for the forward voltage drop of the diode at 1 mA current is obtained.

Capacitor measurements are governed by Formula (2). When a constant current is suddenly applied to both ends of a discharged capacitor under measurement, the voltage at both ends will vary from zero as the time increases. The rate of change $$\frac{\Delta u_c}{\Delta t}$$

of this voltage is directly proportional to the value of the current applied and inversely proportional to the capacitance of the measured capacitor. Knowing the value $i_c$ of the current output from Part D and measuring the variation in $\Delta u_c$ of the voltage on the capacitor with Part A in a certain time interval $\Delta t$, we can obtain the numerical value of the capacitance of the measured capacitor:

$$C = \frac{i_c \Delta t}{\Delta u_c}.$$

This equation is another expression of Formula (2). If the applied constant current is backward, the voltage on the capacitor will decrease, and the rate change of the voltage decrease is still directly proportional to the value of the applied current and inversely proportional to the capacitance of the measured capacitor.

With respect to inductance measurements, it is obvious from Formula (3) that the current through the measured inductor will not change suddenly. For this reason, when attempting to apply an expected current to an inductor, the opposing electromotive force generated by the inductance will make Part D unable to output the expected current value, thus resulting in a maximum output voltage (e.g., 2 V) from Part D. Under the action of this voltage, the current in the inductance will increase gradually until the current value expected by Part D is reached. The voltage at both ends of the inductor will decrease, and finally this voltage will be maintained at the voltage drop generated by the inductor's essential resistance to the applied current. If the current is suddenly interrupted, a large opposing electromotive force will be generated under the action of the inductance, with a backward voltage generated at both ends. Part B, sensing this feature, can switch to make Part D output a triangle wave. When the slope $$\frac{di}{dt}$$

of the triangle wave is fixed at a certain value, Formula (3) predicts that there will be a constant voltage $$u_L = L\frac{di}{dt}$$

in direct proportion to the inductance, which is a positive value when the current increases and a negative value when it decreases. In accordance with the slope $$\frac{di}{dt}$$

of the current change and measured voltage $u_L$, we can obtain a numeric value for the inductance. Based on the voltage drop generated by the inductance's internal resistance, measured by applying a DC current at the time of starting judgment, we can obtain the internal resistance.

Figure 2:
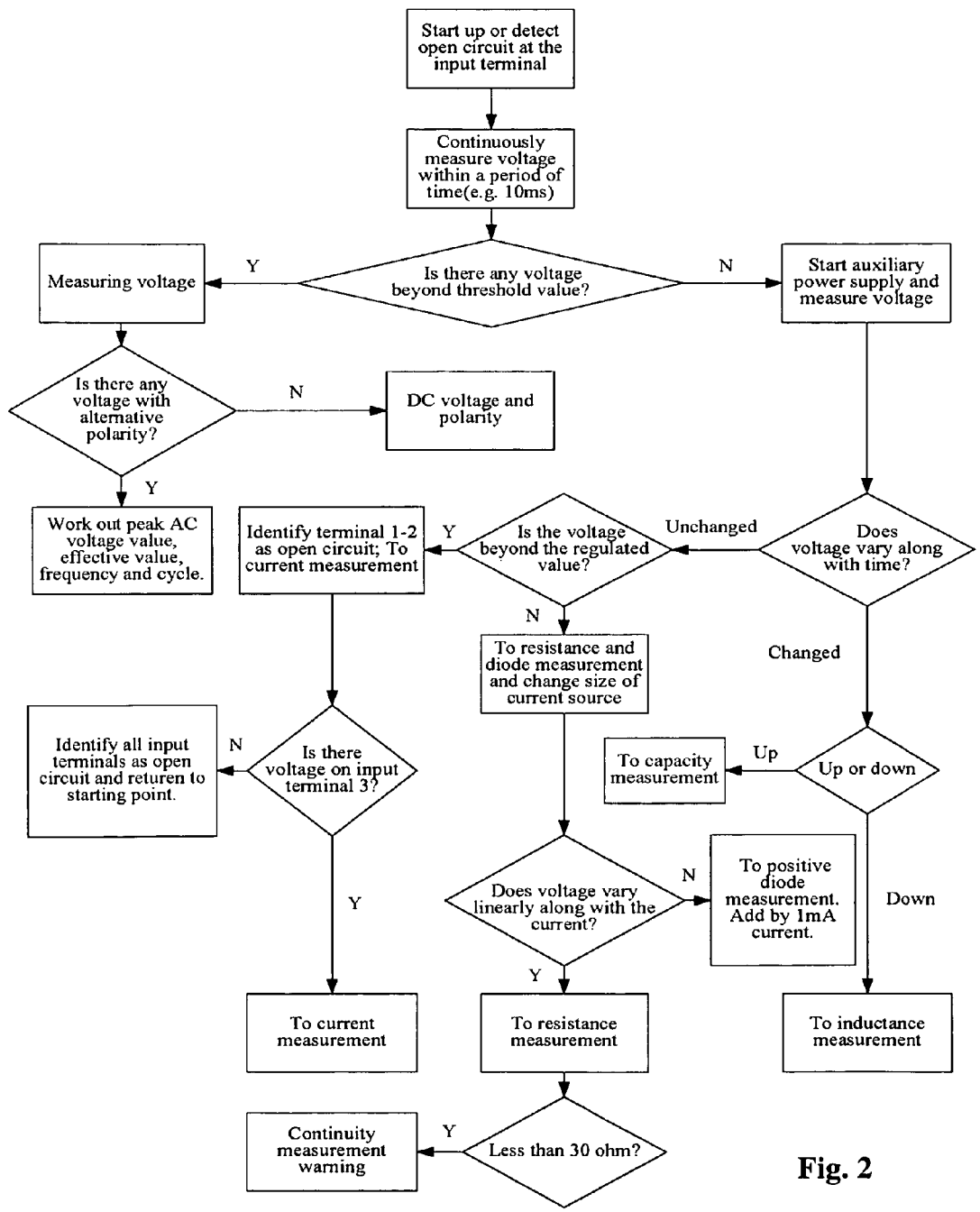
FIG. 2 shows a flow chart of main function procedures or states for the automatic selection of the measurement function in the implementation shown in FIG. 1.

The flow chart in FIG. 2 below further describes the working process of this invention. At the starting point, after the multimeter receives the information that the input terminal is under open circuit, the microprocessor will start the function detection procedure. First, the fast analog/digital converter of the function Part A is enabled to continuously measure the voltage between Input Terminals 1 and 2 over a period of time (e.g., 10 ms), to see if the voltage exceeds the regulated threshold value. As mentioned above, the purpose of setting a threshold is to avoid an error function judgment caused by an external interference signal when the input terminal is under open circuit. The purpose of continuous observation for a period of time is to avoid a fast analog/digital converter error judgment that a voltage input is absent simply by sampling over the zero point of the AC voltage when there is an AC voltage (e.g., 50 Hz) input.

If the voltage exceeds the threshold value applied between Input Terminals 1 and 2, judgment by the microprocessor will enter the multimeter into the procedure for voltage measurements. Generally, when starting a measurement, Part A, the fast voltmeter with automatic range detection, will be set to measure within the maximum range of voltage measurements. This range is then adjusted to the proper range in accordance with the peak voltage measured. Based on the data measured, it is easy to know whether the voltage alternates polarity.

If the voltage alternates polarity, the measured voltage is an AC voltage. As long as the fast analog/digital converter can obtain sufficient sampling of value within a cycle of the AC voltage, it is easy to obtain data for AC voltages, including peak value, true effective value, frequency, or cycle. These measurement results can be selected to be fully or partially displayed upon demand. Obviously, the sampling speed of the fast analog/digital converter and the processing speed of the microprocessor limit the maximum frequency width of the measurable AC voltage. This invention, by adopting another advantage of the fast analog/digital converter, will not make significant measurement errors due to inappropriate selection of the range when measuring alternating waveform signals with high peak factors (high peak voltage but low effective value), which is currently seen in common true effective value multimeters with automatic range detection. Because the multimeter in this invention selects a range based on the peak voltage measured, what is measured is a true and complete waveform, whereas common true effective value multimeters select a range based on the effective value of the voltage and will not measure the tops of the peak voltages, thereby generating significant errors.

If the voltage does not display an alternating polarity, the measured voltage is DC voltage, and the polarity is known at that time. The whole measurement is performed simply by sending the voltage value and its polarity to the Part C display for displaying by Part B. If DC signals overlap with AC ripples, there will be fluctuations against the data measured by the fast voltmeter with automatic range detection. The common treatment is to apply the same treatment used for AC signals. The true effective value is determined within a period of time as the a result of the final measurement. To measure the DC signal from an AC half-wave rectification or full-wave rectification, or to measure a unidirectional pulse signal, precise data can be obtained. Under a variety of signal demands, the multimeter can additionally determine and display the peak value or effective value.

For the case that the voltage does not exceed the regulated threshold value, the multimeter is in a measurement state function for passive components. The microprocessor of Part B will control the auxiliary power supply of Part D to inject different test currents, including 0.01 μA, 1 μA, and 1 mA to the Input Terminal 1 in sequence. The maximum output voltage is, for example, 2 V.

When the current source is 0.01 μA, 1 μA, the function Part A will be in the state of direct input of a high input impedance without attenuation, with a range scope set, for example, to ±400.0 mV. When the current source is 1 mA, Part A will be in the state of input with ten-fold attenuation, with a range scope set to ±4.000 V.

Each time after a different current is injected, Part A will continuously measure the voltage between Input Terminals 1 and 2, and Part B identifies whether there are variations over time. Because the voltage will never vary with time under the action of certain currents, regardless of the resistance measurements, diode measurements, or input terminals under open circuit, such a case will occur only when energy storage elements, such as capacitors or inductors, are connected between the input terminals. For this reason, after a fixed current source is suddenly applied to Input Terminals 1 and 2, a judgment can be made according to whether the voltage varied with time, to distinguish of inductance and capacitance measurements. This judgment step can be ignored if the automatic detection and measurement of energy storage elements such as capacitors and inductors is not necessary.

If an inductance is connected between input terminals, the current in the inductance will not change suddenly, and there will first be a high voltage (equal to the voltage value of the current source's maximum output voltage). After a period of transition, the voltage will finally reach the value of the voltage drop of the currently applied by a current source due to the inductor's internal resistance because the current in the inductor will increase to the output value expected by the current source. This is commonly for small voltage values, below +400 mV. This feature may be used to judge whether an inductance measurement is necessary. After entering the inductance measurement procedures, the current source switches to an output a triangle wave of a certain slope, and the voltage will be related to the inductance and drive current slope between Input Terminal 1 and 2. If the slope based on the measured voltage changes, automatic selection of a different appropriate inductance range of a different size can be realized.

If a discharged capacitor is connected between the input terminals, the voltage on the capacitor will not change suddenly, and there will be a linear voltage increase with time. The features of this transitional procedure may be used to judge whether a capacitor measurement is necessary. After entering the capacitor measurement procedures, the charging speed can be changed by changing the current output from the current source and automatic range selection is available by selecting a proper current value based on the size of the measured capacitor. For continuous measurements of a capacitor, if the voltage on the capacitor is charged to a certain value (e.g., 400 mV), the current source will switch to generate an action that enables the capacitor to discharge, say, by enabling the measured capacitor to be under short circuit or by applying a backward current. However, the capacitor must be discharged prior to measurement. Otherwise, if there is a residual voltage exceeding the threshold voltage on the capacitor, the multimeter will enter the voltage measurement state to measure this voltage rather than the capacitance.

If no voltage variations with time are detected, or automatic identification and measurement of the inductance and capacitance functions is not necessary, the multimeter will enter the measurement procedure for a resistor or diode. At that time, there will be two cases for the current of the auxiliary power supplies:

TABLE 1

Response under Different Measurement Current

| | | Measurement Current | | |
| --- | --- | --- | --- | --- |
| | | 0.01 µA | 1 µA | 1 mA |
| Measured Object | | | Measurement Result | |
| Open Circuit (or R) 40MΩ) | | >400.0 mV | >400.0 mV | 2 V |
| Resistance | 400kΩ < R < 40MΩ | <400.0 mV | >400.0 mV | 2 V |
| R | 400Ω ≦ R ≦ 400kΩ | ≦004.0 mV | ≦400.0 mV | ≧400.0 mV |
| | R < 400Ω (Note 1) | 000.0 mV | <000.4 mV | <400.0 mV |
| Diode | Backward (Note 2) | High Impedance | High Impedance | 2 V |
| | Forward (Note 3) | Higher Impedance | Lower Impedance | Lowest Impedance |

Note 1:
If the commonly seen continuity measurement warning function for the multimeter is necessary, a judgement step can be added, which is to judge whether to give a buzz in accordance warning threshold value (e.g., less than 30 ohm) or to give the measurement result.

Note 2:
By applying of a voltage in the backward direction of a diode, the said high impedance can be equal to that of the open circuit or to an impedance less than 40 MΩ. A smaller current source can be used to measure the difference between the backward leakage currents of each diode. The following treatment is necessary at this time:
a. If the highest output voltage (e.g., 2 V) of the current source is measured when the current source is 1 mA, the lower impedance measured shall be taken as the measurement result;
b. If the voltage measured is lower than the highest output voltage when the current source is 1 mA, the voltage measured at this time shall be taken to be the measurement result, because it may be a Zener diode with a breakdown voltage lower than 2 V, for example, a 1.2 Zener diode.

Note 3:
Under application of a forward voltage to the diode, the said higher, lower, and lowest impedance values are in relative terms. in accordance with the forward bias properties of the diode, a lower impedance is obtained when the through current is high. At this time, the voltage value measured under 1 mA current shall be displayed in the way that common multimeters measure the diode currents.

We can distinguish an open circuit from a resistor or a diode measurement using Table 1.

1. If all voltage measurements exceed the maximum range (400 mV) of the function component A during application of measurement currents of 0.01 µA and 1 µA, while the voltage measured is close to the maximum output (2 V) of the current source, as in the case of a measurement current of 1 mA (at this time, the maximum range of the function Part A is 4 V), an open circuit state is present between Input Terminals 1 and 2. Next, the function Part A will detect that there is no voltage between Input Terminals 3 and 2.

a. If a voltage is present, switch to the current measurement state. Treat the measurement result, judge it, display whether it is AC or DC current, and display its value in accordance with Ohm's Law and the size of the current and resistance connected to the Input Terminals 3 and 2.

b. If the voltage between Input Terminals 3 and 2 is zero, all input terminals are assumed to be in an open circuit state, and the measurement procedure returns to the initial state.

2. The following three cases fall into the category of a resistance measurement:

a. If the voltage measured is less than 400 mV at 0.01 µA current source current, higher than the maximum measurement value (400 mV), at this time 1 µA, and the maximum output of the current source measured to be 2 V (the measuring range of the voltmeter has been changed to a maximum of 4 V) at 1 mA current source current, then 0.01 µA is selected as the measurement current. The value of the measured resistance can be determined in accordance with Formula (1), between 400 KΩ and 40 MΩ.

b. When the voltage measured is lower than 4 mV at 0.01 µA current source current, lower than 400 mV at 1 µA, and higher than 400 mV at 1 mA, 1 µA is selected as the measurement current. The value of the measured resistance can be determined to be between 400 KΩ and 40 MΩ.

c. When the voltage measured is near zero at a 0.01 µA current source current, less than 0.4 mV at 1 µA, and less than 400 mV at 1 mA current source current, 1 mA is selected as the measurement current. The value of the measured resistance can be determined to be less than 400Ω. To increase the number of digits in a reading, the voltmeter of function Part A can be changed to the 400 mV range at this time. Under conditions in which a continuity measurement warning function is necessary; a step of judging whether the voltage is lower than the warning threshold is added.

3. If the measured object is a diode, it can be separated from other cases in accordance with Table 1.

Under application of a backward voltage to a diode, a high impedance will usually be measured. The said high impedance can be equal to that of the open circuit or it can be less than 40 MΩ, as measured using a lower current source to measure the difference between the backward leakage currents of each diode. The following treatment is necessary at this time:

a. If the highest output voltage (e.g., 2 V) of the current source is measured for a 1 mA current source, the lower impedance measured at the lower current shall be taken to be the measurement result;

b. If the voltage measured is lower than the highest output voltage when the current source is 1 mA, showing that there is backward breakdown, the voltage measured at this time shall be taken to be the measurement result, because it may be a Zener diode with a breakdown voltage lower than 2 V, for example, a 1.2 V Zener diode.

Under the diode forward state, there will different breakover states under the actions of different current sources. The high impedance, lower impedance, lowest impedance listed in Table 1 are in relative terms. Based on the forward features of a diode, a lower impedance is measured at higher currents. At this time, voltage values measured at 1 mA current shall be displayed in the way that common multimeters display diode measurements.

During the measurement described above, the multimeter must be returned to the original state and are judgment made as soon as an abnormal voltage is measured.

Figure 3:
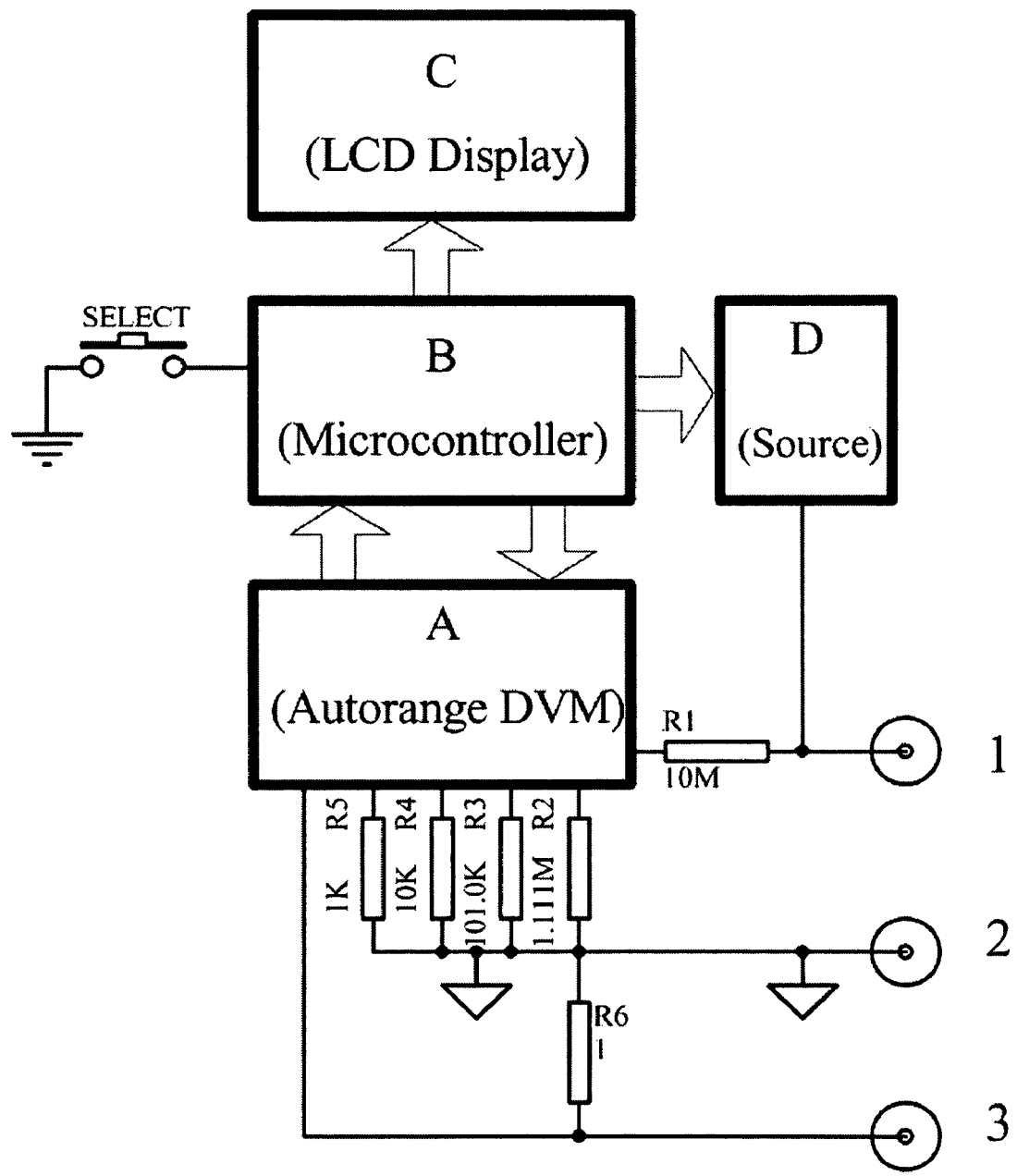
FIG. 3 shows a principle diagram of the digital multimeter that realizes selection of measurement functions only by one button, in which a function selection button is added.

Based on the above-mentioned invention, a digital multimeter that selects a measurement function with a single button can also be realized. That is, simply by adding a function selection button, the automatic function selection state will exit the control of the internal microprocessor when this button is pushed, and the user may specify the measurement function state by adjusting the internal electronic switch and auxiliary sources based on different measurement functions. By pushing this function selection button sequentially, the measurement function can be switched and selected. For example, the initial state at startup is the automatic function selection state. The multimeter will enter into a resistance measurement function upon pushing the function selection button. An AC voltage measurement function is achieved with another push. Another push enters the multimeter into the sequence for DC voltage measurements, frequency measurements, diode measurements, continuity measurements, capacitor measurements, inductance measurements, DC current measurements, AC current measurements, and then back to the automatic selection measurement state for functions, including voltage, resistance, current, and others. FIG. 3 provides the principle block diagram.

Figure 4:
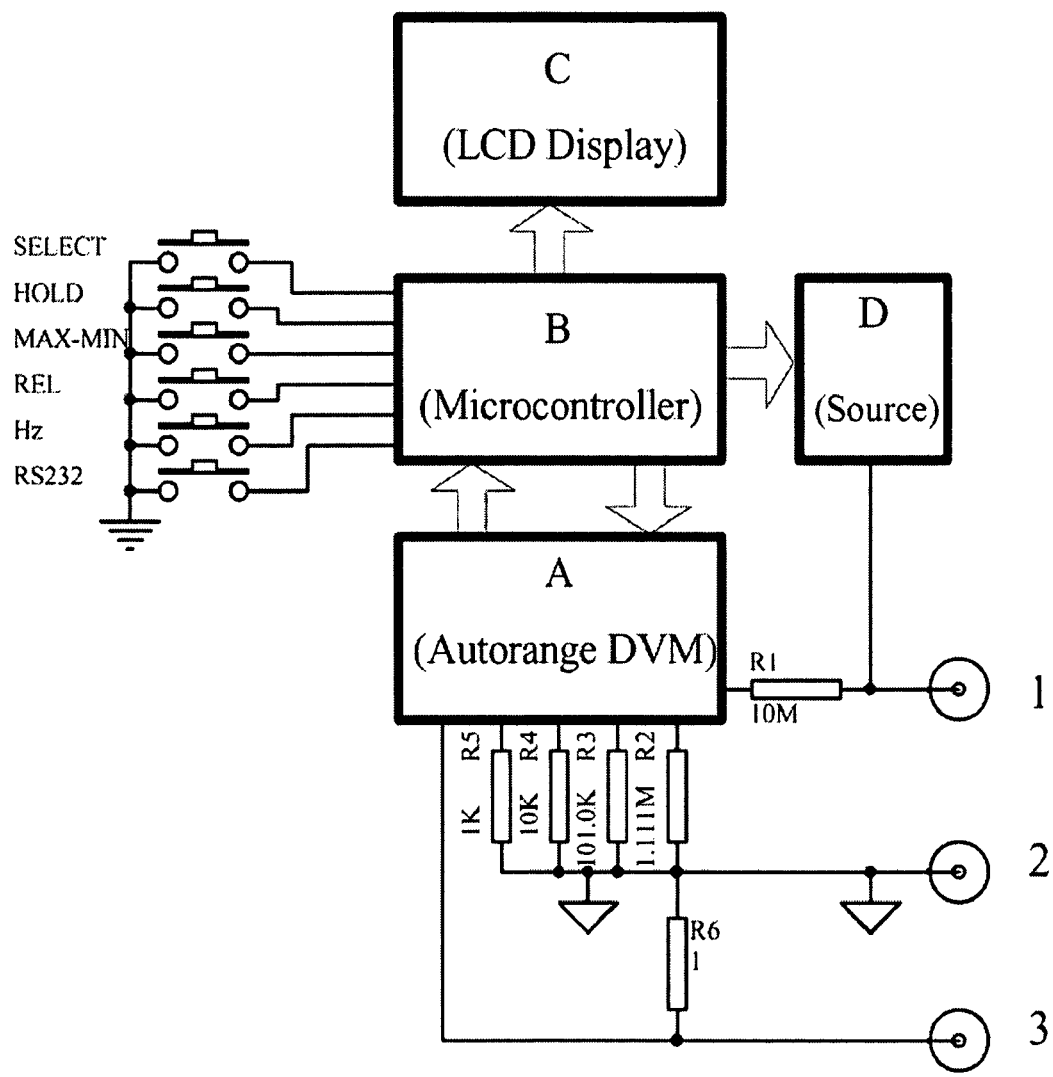
FIG. 4 shows a principle drawing of the digital multimeter after the auxiliary function selection button is added.

FIG. 4 demonstrates that additional functions commonly seen on common digital multimeters, including data hold, display of maximum/minimum value, display of difference values, and RS232 communication functions for connecting to an external PC, can fully be added to the above-mentioned invention upon demand.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

What is claimed is:

1. A digital multimeter for automatically selecting measurement functions comprising:
    input terminals of a measured object;
    an analog/digital conversion circuit;
    a microprocessor;
    a potential divider network;
    an electronic switch;
    a display; and
    a fast analog/digital converter;
    wherein, said fast analog/digital converter is connected to said input terminal of the measured object by said potential divider network to obtain a fast measurement of the voltage between said input terminals;
    said analog/digital conversion circuit inputs said fast measurement of the voltage into said microprocessor for analysis and processing, said microprocessor controls said electronic switch to switch said potential divider network by including additional resistances into said potential divider network and choose a measuring range for the fast analog/digital converter;
    said microprocessor controls an auxiliary program-controlled voltage and current source in connection with the input terminals of the measured object and, according to a result of voltage variations by said fast analog/digital converter, choose a measurement method and the measuring range for the fast analog/digital converter;
    when said auxiliary program-controlled voltage and current source is actively applied to the measured object at the input terminal, the connection between said program-controlled voltage or current source controlled by the microprocessor and said input terminal is cut off;
    when said auxiliary program-controlled voltage and current source is passively applied to the measured object at the input terminal, the connection between the said program-controlled voltage or current source controlled by the microprocessor and said input terminal is connected;
    said microprocessor controls the display to show a measured value.

2. The digital multimeter for automatically selecting measurement functions of claim 1, wherein,
    said microprocessor automatically judges whether the measured object provides a DC or an AC signal according to the data output by the fast analog/digital converter when detecting an external voltage, and the microprocessor determines the measured result by analysis and processing.

3. The digital multimeter for automatically selecting measurement functions of claim 1, wherein,
    when no external voltage is detected at said input terminal, an auxiliary program-controlled voltage or current source is input to the input terminal by said microprocessor; the fast analog/digital converter inputs the measured result into the microprocessor for analysis, which can judge what analog quantity the measured object connected between the input terminals delivers, and the microprocessor properly processes the result measured by the fast analog/digital converter and the microprocessor determines the measurement result by choosing a properly auxiliary program-controlled source to act on the measured object.

4. The digital multimeter for automatically selecting measurement functions of claim 1, wherein,
    said program-controlled voltage or current source controlled by said fast analog/digital converter and said microprocessor selects multiple analog measurements and a measurement range.

5. The digital multimeter for automatically selecting measurement functions of claim 4, wherein,
    when measuring said passive analog quantity of the object, a micro test current is output first to apply to the input terminal a circuit with high input impedance.

6. The digital multimeter for automatically selecting measurement functions of claim 1 further comprising a selection button for switching between automatic selection of measurement functions and manual selection of measurement functions by a user.

7. The digital multimeter for automatically selecting measurement functions of claim 1, wherein said microprocessor can display a waveform graph of a signal that varies with time and a graph of a value variation over time using storing partial measurement data.

* * * * *